United States Patent [19]

Kinoshita et al.

[11] Patent Number: 4,647,978
[45] Date of Patent: Mar. 3, 1987

[54] IMAGE SENSING APPARATUS WITH MEANS FOR REMOVING UNNECESSARY CHARGES

[75] Inventors: Takao Kinoshita, Tokyo; Shinji Sakai, Yokohama; Akira Suga, Yokohama; Akihiko Tojo, Yokohama, all of Japan

[73] Assignee: Canon Kabushiki Kaisha, Tokyo, Japan

[21] Appl. No.: 697,155

[22] Filed: Feb. 1, 1985

[30] Foreign Application Priority Data

Feb. 6, 1984 [JP] Japan .................................. 59-20586

[51] Int. Cl.⁴ .............................................. H04N 5/30
[52] U.S. Cl. ....................................... 358/213; 357/24
[58] Field of Search ...................... 358/211, 212, 213; 357/24 LR

[56] References Cited

U.S. PATENT DOCUMENTS

| | | | |
|---|---|---|---|
| 3,931,463 | 1/1976 | Levine | 357/24 LR |
| 4,490,744 | 12/1984 | Levine | 358/213 |
| 4,498,105 | 2/1985 | Crawshaw | 358/213 |
| 4,528,596 | 7/1985 | Cope | 358/213 |
| 4,577,115 | 3/1986 | Rentsch | 358/213 |

FOREIGN PATENT DOCUMENTS

| | | | |
|---|---|---|---|
| 54-127621 | 10/1979 | Japan | 358/213 |
| 59-12674 | 1/1984 | Japan | 358/213 |

Primary Examiner—Gene Z. Rubinson
Assistant Examiner—L. C. Schroeder
Attorney, Agent, or Firm—Fitzpatrick, Cella, Harper & Scinto

[57] ABSTRACT

An image sensing apparatus comprises: a photo detecting unit for converting an optical image to electrical information; and unnecessary charge transfer unit, formed in a peripheral portion of the photo detecting unit, for transferring the unnecessary charges; a charge removing unit provided at the final end of the unnecessary charge transfer unit; and a drive circuit for driving the unnecessary charge transfer unit synchronously with the transfer of the whole electrical information in the photo detecting unit.

20 Claims, 10 Drawing Figures

IMAGE SENSING APPARATUS WITH MEANS FOR REMOVING UNNECESSARY CHARGES

BACKGROUND OF THE INVENTION

1. Field of the Invention

The present invention relates to an image sensor or an image sensing apparatus with less noise.

2. Description of the Prior Art

Various kinds of image sensors have been conventionally considered as shown in the Official Gazette of Japanese Laid Open Patent Application No. 32595/1975.

FIG. 1 is a diagram showing an example of such a sensor.

In the diagram, a reference numeral 1 denotes a photo detecting unit; 2 is a memory unit; 3 a horizontal shift register; 4 an output amplifier; and 5 a light receiving window corresponding to the window provided in the package of a CCD.

In such a sensor, an optical image which has entered the photo detecting unit 1 through the window 5 is converted to distribution information made up of charges. The charge information formed in the photo detecting unit is read out for every horizontal line through the horizontal shift register 3 and output amplifier 4 for a predetermined interval.

Charges are also formed in a semiconductor substrate around the photo detecting unit 1 due to the light receiving window 5 and these charges leak into the photo detecting unit 1. Thus, there is the drawback that the noise is easily added to the video signal responsive to the right and left side end portions of the photo detecting unit 1 in the diagram.

In addition, there is another drawback, that thermions are formed even near the memory unit 2, into which these thermions leak.

SUMMARY OF THE INVENTION

It is an object of the present invention to provide an image sensor or image sensing apparatus of a simple arrangement which can eliminate the above-mentioned drawbacks of the conventional technology.

To accomplish the above object, an image sensor of an embodiment according to the present invention comprises a photo detecting unit for converting an optical image to electrical information, unnecessary charge transfer units, formed in peripheral portions of the photo detecting unit, for transferring unnecessary charges, and charge removing sections, provided at the final ends of the unnecessary charge transfer units, for removing the charges transferred by the unnecessary charge transfer units; therefore, it is possible to obtain an image sensor which can eliminate the influence of the unnecessary charges which are mixed from the end portions of the photo detecting unit with a simple arrangement.

On one hand, an image sensing apparatus of another embodiment of the present invention comprises a photo detecting unit which converts an optical image to an electrical signal and has transfer electrodes, and driving means for supplying signals to the transfer electrodes for the photo detecting unit in such a manner that the charges in the region in the more peripheral portion of the photo detecting unit are read out along a predetermined readout path and at the same time the charges in the region in the inner portion of the photo detecting unit are transferred into a portion different from the readout path; this arrangement makes it possible to obtain an image sensing apparatus with a good S/N ratio in which the noise can be easily removed.

Other objects and features of the present invention will be apparent from the following detailed description in conjunction with the accompanying drawings.

DETAILED DESCRIPTION OF THE PREFERRED EMBODIMENTS

The present invention will now be described with reference to an embodiment.

Figure 1:
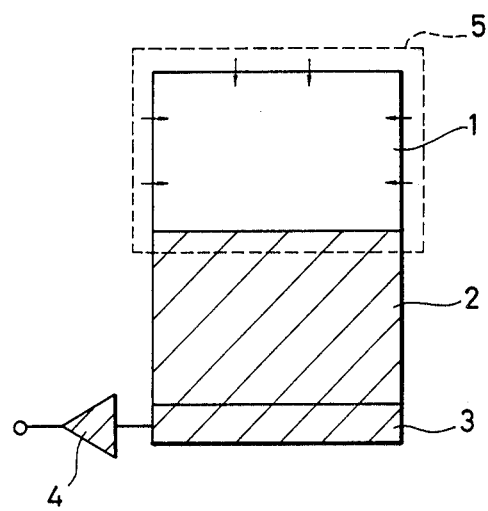
FIG. 1 is a diagram for explaining a conventional example.
Figure 2:
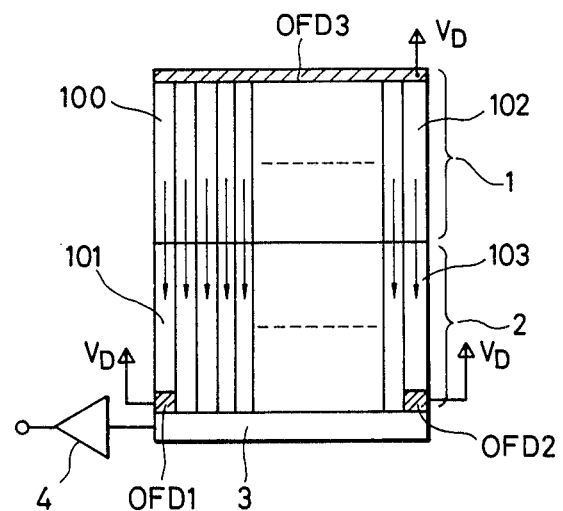
FIG. 2 is a diagram for explaining the first embodiment of an image sensor of the present invention.

FIG. 2 is a diagram showing an arrangement of the first embodiment of an image sensor of the present invention, in which the similar parts and components to those shown in FIG. 1 are designated by the same reference numerals.

The photo detecting unit 1 and memory unit 2 consist of equal numbers of vertical shift registers, i.e., units 1 and 2 both have the same number. The respective vertical shift registers are separated from one another by channel stops.

In the diagram, numerals 100 to 103 denote transfer units, herein termed "unnecessary charge transfer units," for transferring unnecessary charges, in which the units 100 and 102 are provided in the end portions of the photo detecting unit 1, while the units 101 and 103 are provided in the end portions of the memory unit 2.

On the other hand, the transfer units 100 and 101 and the transfer units 102 and 103 form common charge transfer paths, respectively.

OFD1 to OFD3 indicate drains serving as charge removing sections. OFD1 and OFD2 serve to drain the charges transferred by the transfer units 101 and 103 to the drains, respectively.

OFD3 serves to drain the charges which have overflowed in the photo detecting unit 1.

A large positive voltage $V_D$ is applied to each of the drain electrode sections OFD1 to OFD3.

Figure 3:
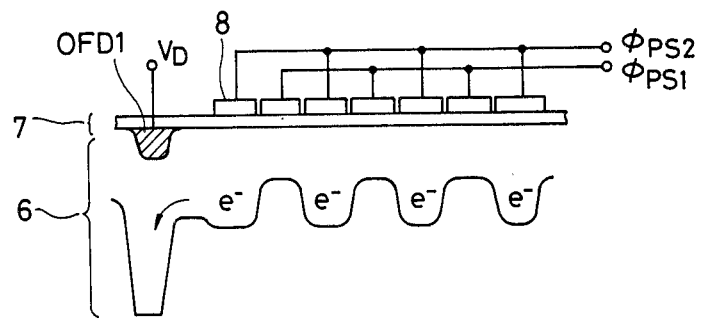
FIG. 3 is a cross sectional diagrammatical view of the main part of the image sensor shown in FIG. 2.
Figure 4:
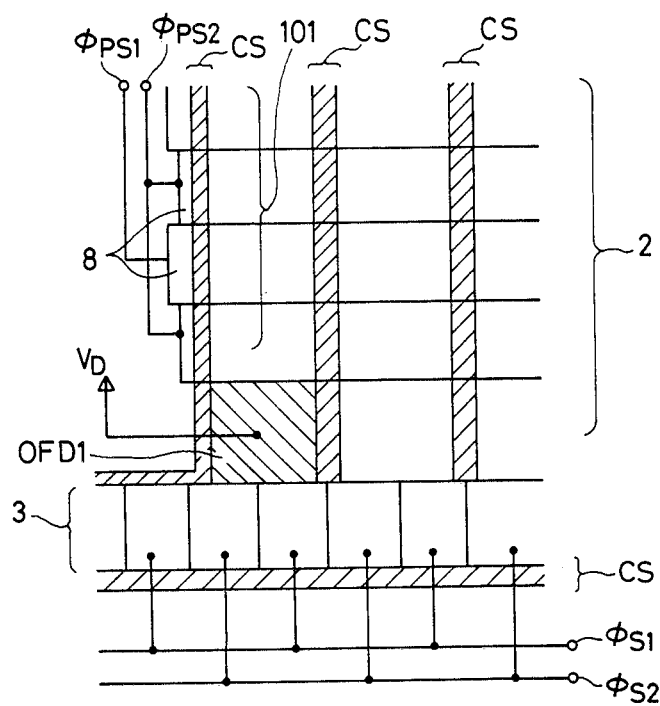
FIG. 4 is an electrode pattern diagram of the main part of the image sensor shown in FIG. 2.

FIG. 3 is a cross sectional diagrammatical view of the charge transfer unit 101 and drain OFD1. FIG. 4 is an electrode pattern diagram near the boundary between the charge transfer unit 101 and the drain OFD1.

In the diagram, a numeral 6 denotes, for instance, a P-type silicon substrate; 7 is an insulation layer consisting of SiO$_2$ or the like; and 8 indicates transfer electrodes made of polysilicon or the like. The transfer electrodes 8 are driven by double phases of transfer pulse $\phi_{PS1}$ and $\phi_{PS2}$.

OFD1 is formed by, for instance, diffusing an n+ impurity region in the substrate 6 or the like.

CS represents channel stops. $\phi_{S1}$ and $\phi_{S2}$ are transfer pulses to transfer the charges in the horizontal shift register 3. The channel stops CS are likewise driven by double phases of those transfer pulses. The driving method, however, is not limited to double phases.

Figure 5:
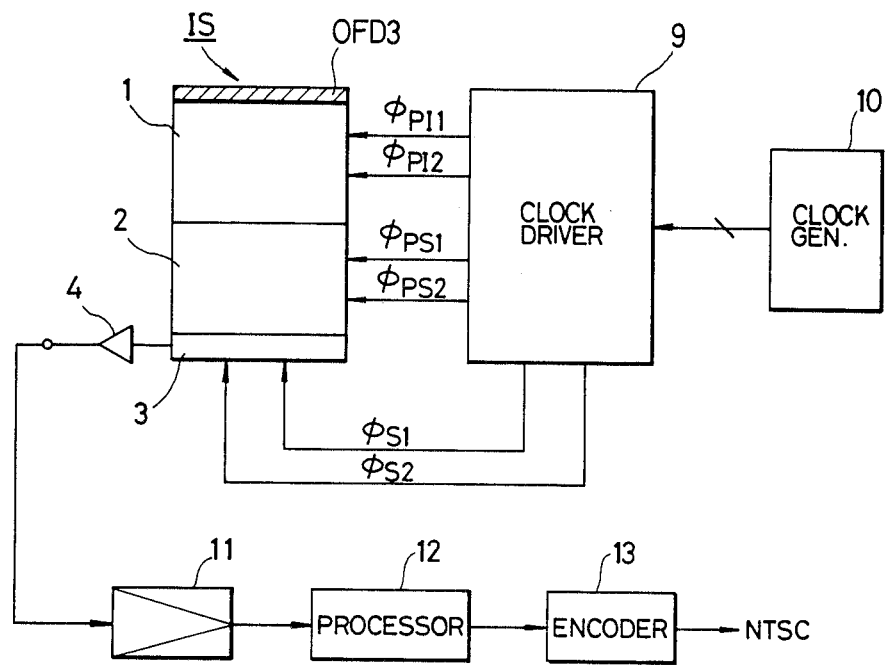
FIG. 5 is a diagram showing an example of an arrangement of an image sensing apparatus using the image sensor shown in FIG. 2.

FIG. 5 shows the arrangement of an image sensing apparatus using the image sensor of the first embodiment. In the diagram, a numeral 9 denotes a clock driver serving as drive means for producing drive pulses $\phi_{PI1}$, $\phi_{PI2}$, $\phi_{PS1}$, $\phi_{PS2}$, $\phi_{S1}$, and $\phi_{S2}$ to drive an image sensor IS in response to various kinds of clock signals produced by a clock generator 10. The pulses $\phi_{PI1}$ and $\phi_{PI2}$ are the pulses to transfer the charges in the photo detecting unit.

A numeral 11 denotes a pre-amplifier; 12 is a processor for performing various kinds of corrections such as gamma correction, aperture correction or the like, and a waveform process; and 13 is an encoder for performing modulation or the like to form a standard television signal of the NTSC system or the like.

Figure 6:
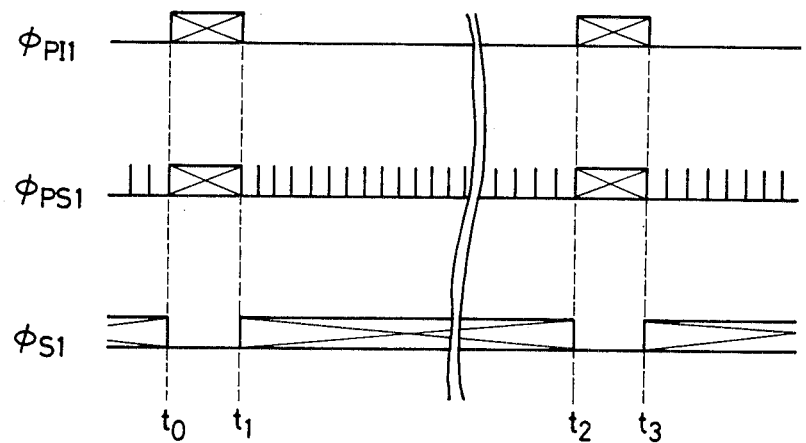
FIG. 6 is a timing chart for the image sensing apparatus of FIG. 5.

FIG. 6 is a diagram showing the timings for the output pulses of the clock driver 9 shown in FIG. 5.

The pulses $\phi_{PI1}$ and $\phi_{PS1}$ and the pulses $\phi_{PI2}$ and $\phi_{PS2}$, which have the phases opposite to phases of $\phi_{PI1}$ and $\phi_{PS1}$, as many as the number of horizontal lines are supplied at a high speed for the interval of $t_0$ to $t_1$, thereby allowing the charge information in the photo detecting unit 1 to be transferred into the memory unit 2 and stored therein. Next, a new image is accumulated in the photo detecting unit 1 for the interval of $t_1$ to $t_2$. During this interval, the charge information in the memory unit is taken into the horizontal shift register 3 by an amount as much as one horizontal line by the pulse $\phi_{PS1}$ and pulse $\phi_{PS2}$, which has the phase opposite thereto. This charge information is sequentially read out by the pulse $\phi_{S1}$ and pulse $\phi_{S2}$, which has the phase opposite thereto.

The pulses $\phi_{PI2}$, $\phi_{PS2}$ and $\phi_{S2}$ have phases opposite to those of the pulses $\phi_{PI1}$, $\phi_{PS1}$ and $\phi_{S1}$, respectively; therefore, they are omitted from FIG. 6.

As described above, according to this embodiment, the charge transfer units to transfer the unnecessary charges are provided in the end portions of the photo detecting unit 1 and memory unit 2, and the charge removing section are provided at the final ends of the transfer units; therefore, it is possible to prevent mixture of thermal or optical unnecessary charges near the peripheral portions of the photo detecting and memory units.

Figure 7:
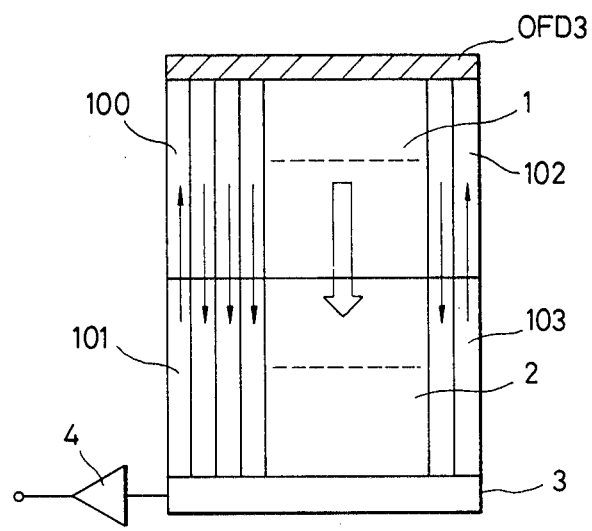
FIG. 7 is a diagram of the second embodiment of an image sensor of the present invention.

Next, FIG. 7 is a diagram showing a second embodiment of an image sensor of the present invention, in which parts and components similar to those shown in FIGS. 1 to 6 are designated by the same reference numerals.

In this embodiment, in place of providing the drains OFD1 and OFD2, the transfer directions of the charge transfer units 100 to 103 in the end (or other peripheral) portions of the photo detecting and memory units are reversed as compared with the transfer directions of the effective charges in the photo detecting unit 1 and memory unit 2, thereby causing the unnecessary charges to be drained into the drain OFD3.

Figure 8:
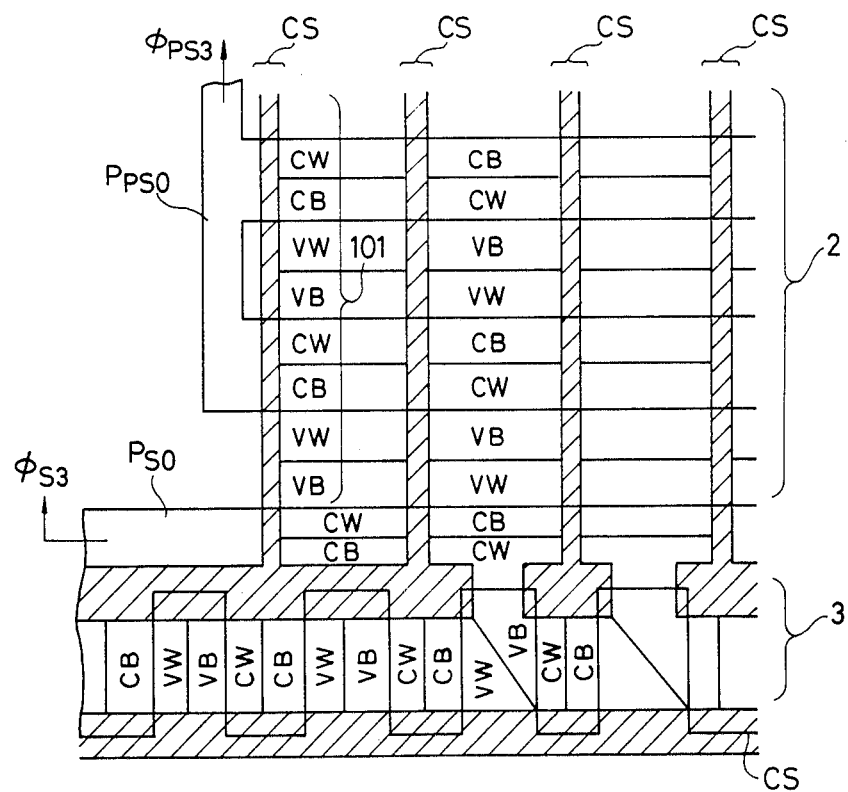
FIG. 8 is an electrode pattern diagram of the main part of the image sensor shown in FIG. 7.

FIG. 8 is a diagram showing an electrode pattern in the boundary region between the charge transfer unit 101 and the horizontal register 3.

In the diagram, the parts and components similar to those shown in FIGS. 1 to 7 are designated by the same reference numerals.

In the embodiment of FIG. 8, the image sensor is driven due to a single phase drive system.

$P_{PSO}$ a is transfer electrode for the memory unit 2; $P_{SO}$ is a transfer electrode for the horizontal shift register 3; CB are clocked barriers; SC denotes clocked wells; VB are virtual barriers; and VW are virtual wells. When it is assumed that the heights of potentials in the CB, CW, VB, and VW with respect to the electrodes are respectively P(CB), P(CW), P(VB), and P(VW), the relations of P(CB)>P(CW) and P(VB)>P(VW) are always satisfied. On the other hand, when a voltage at a high level is applied to the electrodes $P_{PSO}$ and $P_{SO}$ the relation P(VW)>P(CB) is satisfied. When a voltage at a low level is applied, the relation P(CS)>P(VB) is satisfied.

Such potential steps are formed by, for example, ion implantation into the semiconductor substrate 6. In addition, the inverting layers are formed near the boundary portions between the insulation layer 7 and the semiconductor substrate 6 in the regions of VB and VW, thereby preventing influence from the voltage which is applied to the electrode $P_{PSO}$.

In the embodiment, the sequence of the potential steps CB, CW, VB, and VW in the charge transfer units 101 to 103 is set to be opposite to the sequence of the potential steps in the other portions of the photo detecting unit and memory unit. Therefore, by applying an alternating voltage to the electrode $P_{PSO}$, the charges are shifted upwardly in FIG. 8.

Figure 9:
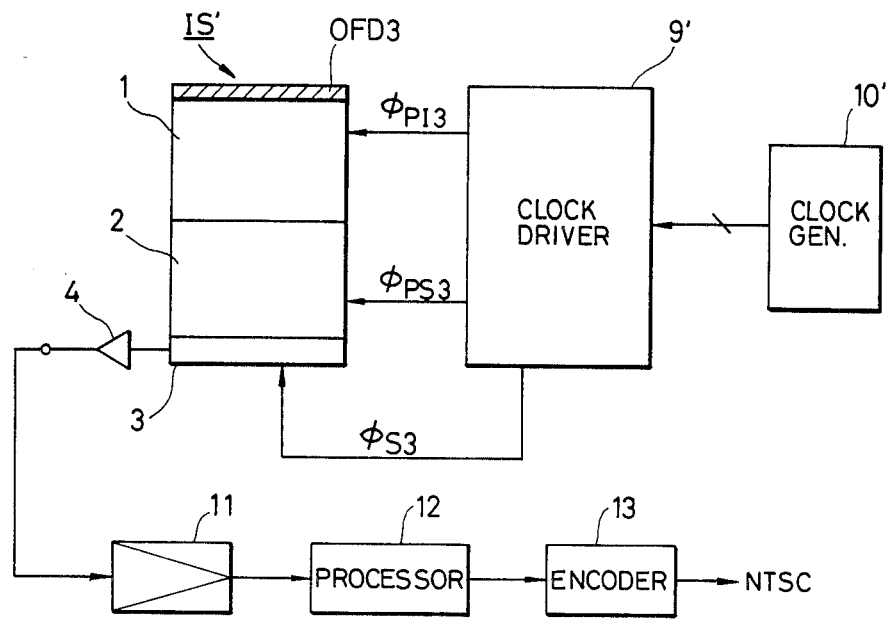
FIG. 9 is a diagram showing an example of an arrangement of an image sensing apparatus using the image sensor shown in FIG. 7.
Figure 10:
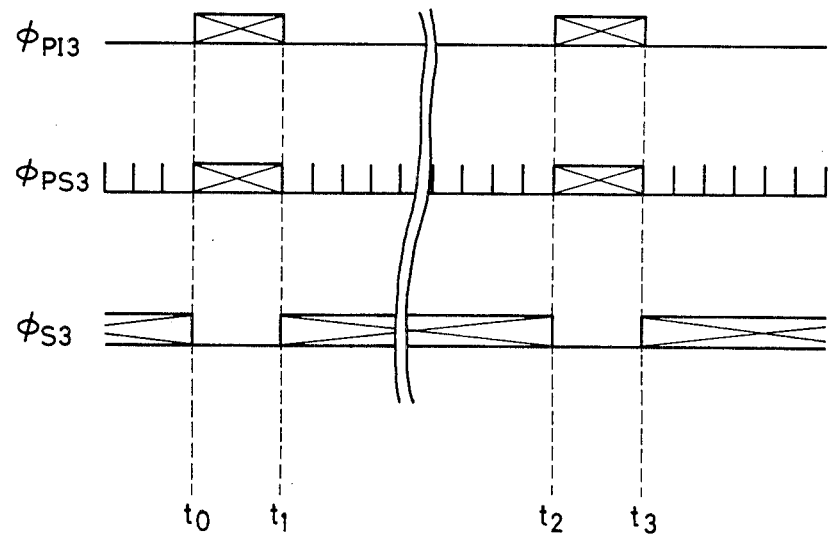
FIG. 10 is a timing chart for the image sensing apparatus of FIG. 9.

FIG. 9 shows the arrangement of a second embodiment of an image sensing apparatus of the present invention. FIG. 10 is a timing chart for the image sensing apparatus of FIG. 9. In the diagrams, the parts and components similar to those shown in FIGS. 1 to 8 are designated by the same reference numerals.

A numeral 9' denotes a clock driver serving as drive means for generating drive pulses $\phi_{PI3}$, $\phi_{PS3}$ and $\phi_{S3}$ to drive an image sensor IS' in response to output clocks of a clock generator 10'.

As shown in FIG. 10, the pulses $\phi_{PI3}$, $\phi_{PS3}$ and $\phi_{S3}$ respectively correspond to the pulses $\phi_{PI1}$, $\phi_{PS1}$ and $\phi_{S1}$ shown in FIG. 6. For the intervals of $t_0$ to $t_1$ and $t_2$ to $t_3$, the vertical transfer and the removal of the unnecessary charges in the side end portions of the photo detecting unit 1 and memory unit 2 are simultaneously executed by the pulses $\phi_{PI3}$ and $\phi_{PS3}$, so that the charges in the memory unit are read out for every horizontal line for the interval of $t_1$ to $t_2$.

As described above, according to the embodiment, there is no need to use the drains OFD1 and OFD2, so that the arrangement is simple and the wiring pattern can also be simplified. On one hand, in both first and second embodiments, the transfer electrode for the charge transfer units 100 to 103 and the electrodes for the photo detecting and memory units are commonly used. Consequently, the manufacturing process is also extremely simple and the transfer units 100 to 103 can be driven synchronously with the transfer of the whole charge information in the photo detecting unit without requiring any particular driving electrodes or drive pulses for the charge transfer units 100 to 103.

In addition, according to the present invention, no great amount of noise is added to the video signal which is read out from the image sensor, so that there is no need to provide a complicated noise removing circuit in the signal processing circuit at the post stage.

On the other hand, the unnecessary charge transfer units are provided in the end portion of both of the photo detecting unit 1 and the memory unit 2 in the foregoing first and second embodiments; however, the invention incorporates an arrangement whereby they are provided only in the end portions of the photo detecting unit.

Further, examples of the drain structure have been mentioned as the charge removing sections to drain the unnecessary charges in the first and second embodiments; however, the charge removing sections also include the charge removing sections to remove the unnecessary charges by periodically performing the recombination of the charges.

What we claim is:

1. An image sensor comprising:
   (a) a photo detecting unit for converting an optical image to electrical information;
   (b) unnecessary charge transfer units, formed in peripheral portions of said photo detecting unit, for transferring unnecessary charges;
   (c) charge removing sections, provided respectively at an end of each of said unnecessary charge transfer units, for removing the charges transferred by said unnecessary charge transfer units; and
   (d) charge readout means for transferring effective charges in said photo detecting unit in one direction to read the charges out, the transfer by said readout means being conducted during the same interval as is the transfer by said unnecessary charge transfer units, and said unnecessary charge transfer units being arranged to transfer the unnecessary charges in a direction opposite to said one direction.

2. An image sensor according to claim 1, further comprising driving means for synchronously driving the charge transfer by said charge readout means and the charge transfer by said unnecessary charge transfer units.

3. An image sensor according to claim 1, wherein said photo detecting unit includings a plurality of vertical shift registers.

4. An image sensor according to claim 3, wherein said unnecessary charge transfer units consist of parts of said vertical shift registers.

5. An image sensor according to claim 1. wherein said charge removing sections are so located that said readout means transfers the effective charges away from said charge removing sections.

6. An image sensor comprising:
   (a) a photo detecting unit for converting an optical image to electrical information;
   (b) a readout path for reading out, in one direction charges in said photo detecting unit; and
   (c) unnecessary charge transfer units, provided at at least a part of the peripheral portion of said photo detecting unit, for transferring unnecessary charges around said photo detecting unit along a path different from said readout path and in a direction opposite to said one direction, the transfer of the unnecessary charge being conducted during the same interval as is the readout along said readout path.

7. An image sensor according to claim 6, further comprising charge removing sections, provided respectively at an end of each of said unnecessary charge transfer units, for removing the charges transferred by said unnecessary charge transfer units.

8. An image sensor according to claim 7, wherein said charge removing sections include drains.

9. An image sensor according to claim 7, wherein said charge removing sections allow the charges to be recombined with charges of the opposite polarity.

10. An image sensor according to claim 6, further comprising driving means for synchronously driving the charge transfer along said readout path and the charge transfer by said unnecessary charge transfer units.

11. An image sensor according to claim 6, wherein said photo detecting unit includes a plurality of vertical shift registers.

12. An image sensor according to claim 11, wherein said unnecessary charge transfer units consist of parts of said vertical shift registers.

13. An image sensor according to claim 7, wherein said charge removing sections are so located that the charges read out along said readout path are read out away from said charge removing sections.

14. An image sensor comprising:
   (a) a photo detecting unit for converting an optical image to electrical information, said photo detecting unit having a relatively inner portion and a relatively peripheral portion;
   (b) a readout path for reading out charges in said relatively inner portion of said photo detecting unit in one direction; and
   (c) transfer means for transferring the charges in said relatively peripheral portion of said photo detecting unit in a direction opposite to said one direction, into a portion different from said readout path, the transfer of the unnecessary charges being conducted during the same interval as is the readout along said readout path, but the transfer direction being opposite to the readout direction of said readout path.

15. An image sensor according to claim 14, further comprising charge removing sections, provided respectively at an end of each of said unnecessary charge transfers units, for removing the charges transferred by said unnecessary charge transfer units.

16. An image sensor according to claim 15, wherein said charge removing sections include drains.

17. An image sensing apparatus comprising:
   (a) a photo detecting unit which converts an optical image to an electrical signal, said photo detecting unit having a relatively inner portion and a relatively peripheral portion, and including transfer electrodes; and
   (b) driving means for supplying signals to said transfer electrodes of said photo detecting unit in a manner such that charges in said relatively peripheral portion of said photo detecting unit are read out in one direction through a predetermined readout path and at the same time the charges in said relatively inner portion of said photo detecting unit are transferred in a direction in said inner portion opposite to said one direction, into a portion different from said readout path.

18. An image sensor comprising:

(a) a photo detecting unit for converting an optical image to electrical information;
(b) a first charge transfer unit for transferring one part of the electrical information in a first direction;
(c) a second charge transfer unit for transferring another part of the electrical information in a second direction different from said first direction; and
(d) electrode means for providing the same pulses to drive said first and second charge transfer units.

19. An image sensor according to claim 18, wherein said photo detecting unit has a relatively inner portion and a relatively peripheral portion, and wherein said first transfer unit transfers the electrical information in said relatively peripheral portion and said second transfer unit transfers the electrical information in said relatively inside portion.

20. An image sensor according to claim 17, further comprising a charge drain unit disposed at the peripheral portion of said photo detecting unit for draining the electrical information transferred by said first charge readout unit.

* * * * *